United States Patent [19]
Saito

[11] Patent Number: 5,944,548
[45] Date of Patent: Aug. 31, 1999

[54] FLOATING MOUNT APPARATUS FOR COAXIAL CONNECTOR

[75] Inventor: Shinichi Saito, Kawasaki, Japan

[73] Assignee: Hewlett-Packard Company, Palo Alto, Calif.

[21] Appl. No.: 08/932,762

[22] Filed: Sep. 17, 1997

[30] Foreign Application Priority Data

Sep. 30, 1996 [JP] Japan ..... 8-257227

[51] Int. Cl.⁶ ..... H01R 9/07
[52] U.S. Cl. ..... 439/248; 439/675
[58] Field of Search ..... 439/248, 501, 439/252, 824, 700, 675, 638, 246, 24

[56] References Cited

U.S. PATENT DOCUMENTS 3,248,495  4/1966  Kastel ..... 439/824
5,558,541  9/1996  Botka et al. .

OTHER PUBLICATIONS

Microwave Test Accessories Catalog 1992–1993 (Hewlett Packard), pp. 11–15, "Adapters, Cables & Connectors".
Sealectro (BICC Electronics), pp. 3–4, "K Connectors".
Sealectro (BICC Electronics), Catalog No. SMA–9, pp. 6–7, "SMA 3mm Miniature R.F. Connectors".

Primary Examiner—Gary F. Paumen
Assistant Examiner—Alexander Gilman

[57] ABSTRACT

A first embodiment of a floating mount apparatus for a coaxial connector includes a coaxial connector with a central axis having a first external diameter region, a second external diameter region adjacent to the first external diameter and a third external diameter region adjacent to the second external diameter. The second external diameter region is smaller than the first external diameter region. A mount member, i.e., a receiving aperture, includes a first internal diameter region, a second internal diameter region and a third internal diameter region adapted to receive the coaxial connector, a clearance existing between the region of the first external diameter and the first internal diameter. The second internal diameter region is less than the first internal diameter region of the mount member and the third external diameter region of the coaxial connector. A spring having a near cylindrical-shape is inserted between the second internal diameter region of the mount member and the second external diameter region of the coaxial connector to bias the coaxial connector.

8 Claims, 4 Drawing Sheets

FLOATING MOUNT APPARATUS FOR COAXIAL CONNECTOR

FIELD OF THE INVENTION

The present invention relates to a device which mechanically couples two coaxial connectors and, more specifically, to a coaxial connector and mount device for use with a test head and prober of a semi-conductor tester. The present invention also relates to a high frequency coaxial connector and mount device adapted for use with a hinge coupled test head and prober.

BACKGROUND OF THE INVENTION

Conventional test systems often include a test head which provides an interface between a testing device and a device under test (DUT) and a prober which determines the test position of the DUT. When connecting a test head to a prober, it is generally accepted that the test head is connected in an upright position onto the top of the prober. In the space above a wafer, a connection ring is provided and attached such that it is supported by the prober. A probe card is connected to the bottom of the connection ring and includes a needle or so forth for probing the wafer.

The test head is coupled to a probe hinge, via an arm. Towards the top of the test head, a DUT board is set. By pivoting centrally around the probe hinge, a state of pressure is applied to the connection ring and contact is made between the test head and the prober. A plurality of pogo-pins are built into the connection ring and allow an exchange of signals between the DUT board and the probe card; and an electrically conductive pad pattern is provided on the DUT board where each pogo-pin makes contact with the probe card. In this way, a signal pathway is formed from the test head to the DUT board, to the connection ring, to the probe card, to the needle and, then, to a chip on the wafer.

The pogo pins are connecting terminals that hold a structure where the pins of a cylinder are supported by way of a spring. The connection is performed by applying the appropriate force to the conductive flat pad which is formed on a base. Such an arrangement provides a simple connection method for mechanically and simultaneously connecting a plurality of pins. This is especially useful for hinge coupled contacts that can be easily connected even though their center axis are tilted at the time of connection.

There is an increasing need for an ability to transmit test signals to a chip on a wafer at very high frequencies (high frequency bands) that reach up to 6 GHz. Such demand for performance cannot be accomplished by using pogo-pins. In the high frequency range, pogo-pins cause a large reflection loss and, realistically, their limit is about 1 GHz.

One possible approach to achieve transmission of high frequency signals of up to 6 GHz is to utilize a coaxial connector. A coaxial connector provides an inexpensive and simple snap-in type of SMB connection. The snap-in type connectors have a male connector and a female connector which are engaged by snapping in the direction of the central axis without rotating them along the cylindrical cross-section of the connectors. However, in reality, it is difficult to stably transmit a high frequency signal in the 6 GHz range using a coaxial connector. Another problem with coaxial connectors involves the absence of a mount construction that is capable of mechanically connecting a plurality of snap-in type coaxial connectors that are hinge coupled.

Other types of coaxial connectors such as a SMA, APC-3.5 or K can also be utilized to transmit high frequency signals in the 6 GHz range. Such connectors utilize screws to perform the connection. As a result, engaging the connector is mechanically cumbersome and time consuming as each screw must be manually secured, one at a time.

U.S. Pat. No. 5,558,541 (assigned to the common assignee of the present invention and incorporated herein by reference) discloses a blind mate connector, which is a snap-in type coaxial connector that has the ability to be mechanically connected and is interchangeable with the SMA connector. The blind mate connector does not have screw threading formed on the male connector. Instead, the screw threading is formed on the female connector such that a connection can be made by sliding the female connector into the male connector. The blind mate connector provides sufficient bandwidth to transmit high frequency signals of up to 6 GHz.

FIG. 1 illustrates the components of the blind mate connector and mount device, disclosed in the U.S. Pat. No. 5,558,541. In FIG. 1, a male connector 116 and a female connector 126 with mount components (an iris 144C, a spring 146 and a lip 148A) are shown. Female connector 126 is attached such that a spring 146 is inserted into a cylindrical component 144 of the test head by way of a collar 148. Female connector 126 engages male connector 116 when a fixture board 114 with male connector 116 is pressed thereon. As fixture board 114 is pressed, female connector 126 and male connector 116 are brought together with appropriate force by way of spring 146 which is compressed by iris 144C and lip 148A of collar 148. Spring 146 also has the effect of absorbing (i.e., adjusting to) the varying heights of each of the male connectors when a plurality of male connectors are attached to fixture board 114.

Although the prior art device shown in FIG. 1 may be utilized for inserting a male connector in the orthogonal direction into a female connector or vice-versa, it is not appropriate when using a prober and test head that are hinge coupled. That is to say, as the hinge is pivoted to connect the test head to the prober, the male connector and female connector move towards each other along an arc defined by the hinge mechanism. At the initial point of contact, both the central axis of the male connector and the female connector are positioned at a different angle (i.e., not aligned). Since the angle of the central axis cannot be changed or re-aligned, the only possible choice is to forcibly engage the connectors which results in abnormal friction and defective connection of the male and female connectors. With this type of coaxial connector for use with high frequency bands, the application of such force also results in a distortion of the structure, thus significantly reducing the electrical properties of the connectors.

Another possible remedy to the above-noted problems is to employ wider play between cylindrical component 144, female connector 126 and collar 148 and/or to tilt the central axis of the female connector. However, such a method requires excessive play which increases the error of the earlier position. Therefore, it can be assumed that a defective engagement will occur.

Accordingly, an objective of the present invention is to provide a floating mount apparatus for a coaxial connector which is suitable for use with hinge coupled devices.

It is a further object of the present invention to provide a coaxial connector and mount construction which allow the central axis of the coaxial connector to automatically adjust in the horizontal and vertical direction to provide a smooth, errorless engagement with another connector.

Another object of the present invention is to provide a floating mount apparatus of a coaxial connector adapted for use with high band signals and a prober and test head that are hinge coupled.

SUMMARY OF THE INVENTION

A first embodiment of a floating mount apparatus for a coaxial connector includes a coaxial connector with a central axis having a first external diameter region, a second external diameter region adjacent to the first external diameter and a third external diameter region adjacent to the second external diameter. The second external diameter region is smaller than the first external diameter region. A mount member, i.e., a receiving aperture, includes a first internal diameter region, a second internal diameter region and a third internal diameter region adapted to receive the coaxial connector, a clearance existing between the region of the first external diameter and the first internal diameter. The second internal diameter region is less than the first internal diameter region of the mount member and the third external diameter region of the coaxial connector. A spring having a near cylindrical-shape is inserted between the second internal diameter region of the mount member and the second external diameter region of the coaxial connector to bias the coaxial connector.

The present invention also provides a third internal diameter region, a back facing groove, on the mount member. The third internal diameter region has a larger diameter than the third outer diameter component, is arranged on the opposing side to the first internal diameter region, and is adjacent to the second internal diameter region.

The coaxial connector can also be divided into two components, a connector and a flange nut. The connector is inserted into the mount hole on one side. The flange nut is then connected into the mount hole from the opposite side of the mount hole such that the coaxial connector is secured to the mount member.

DETAILED DESCRIPTION OF THE INVENTION

Figure 1:
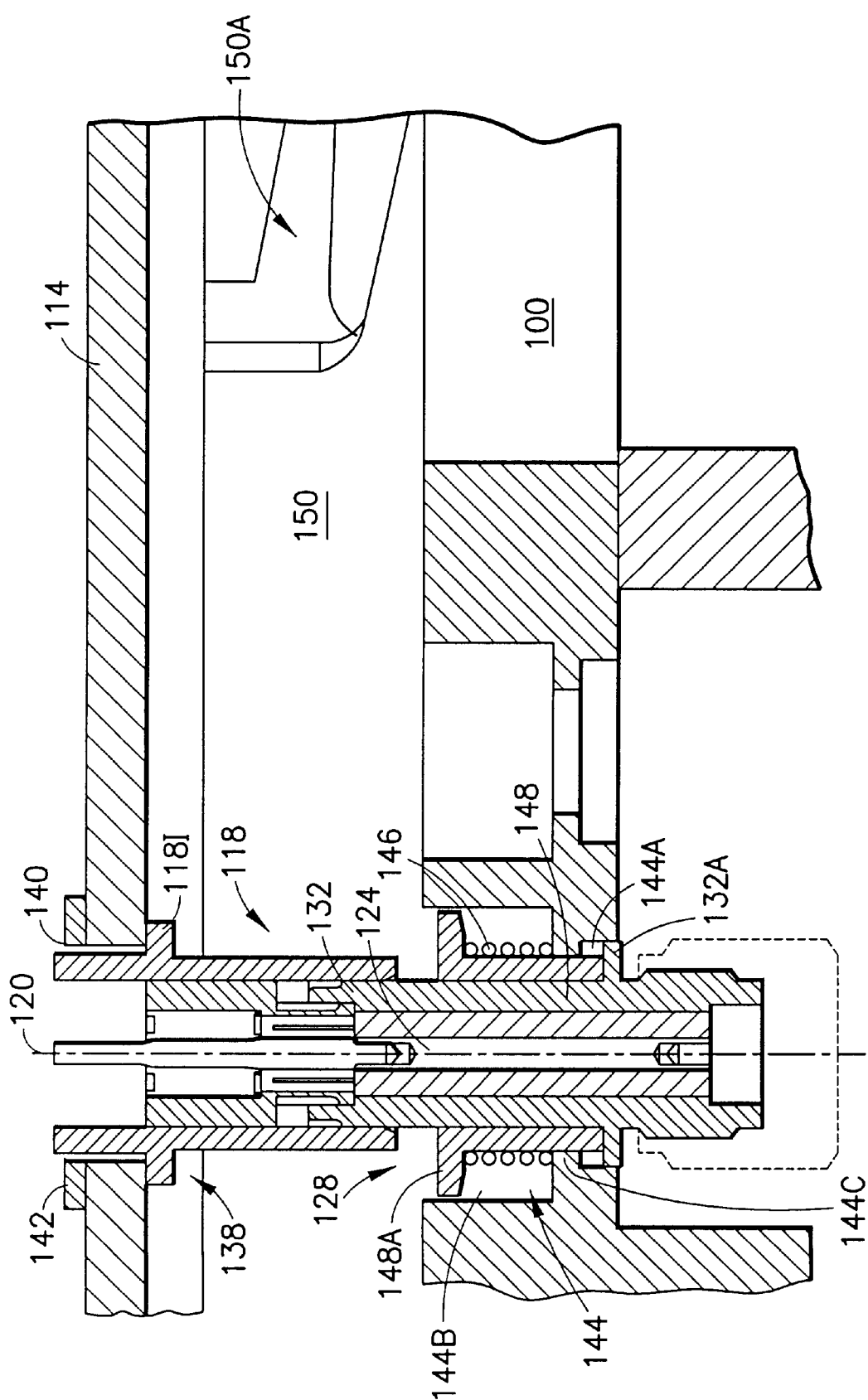
FIG. 1 illustrates a cross-section of a floating mount apparatus of the prior art.
Figure 2A:
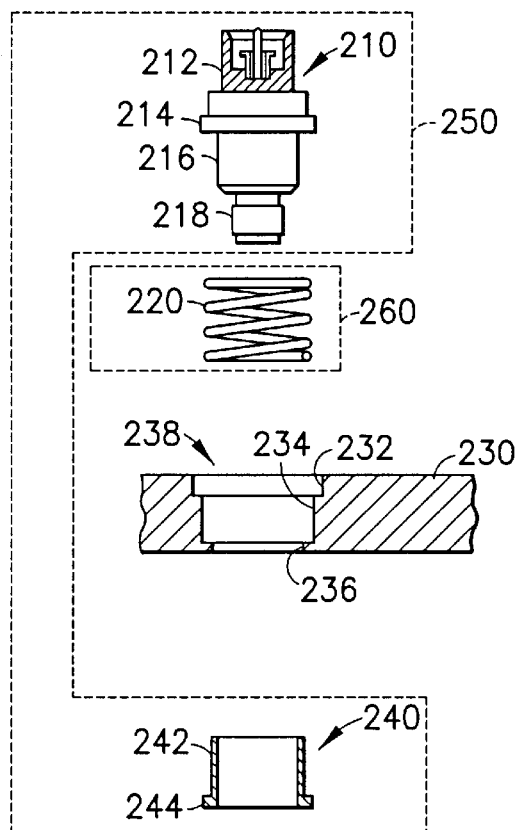
FIGS. 2A, and 2C illustrate a cross-section of a first embodiment of the floating mount apparatus in accordance with the present invention.
Figure 2B:
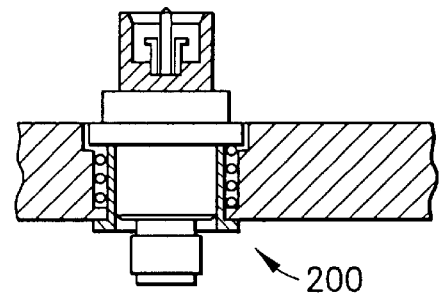

FIGS. 2A and 2B illustrate a first embodiment of a floating mount apparatus of a coaxial connector 200 in accordance with the present invention. Floating mount apparatus 200 includes a mount member 230 with a hole 238 (i.e., a receiving aperture) and a connector component 250 having an upper and lower flange component. An elastic body 260 having a nearly cylindrical shape is positioned in mount hole 238 and interposed between the upper and lower flange components of connector component 250. As shown in FIG. 2B, when the upper and lower flange components are inserted into mount hole 238, connector 250 is secured to mount member, via mount hole 238 such that elastic body 260 cannot be removed by way of either flange component. It is preferred that connector component 250 (FIG. 2A) includes a blind mate connector 210 and a connector nut 240 and that nearly cylindrical elastic body 260 is a coil spring 220.

Figure 2C:
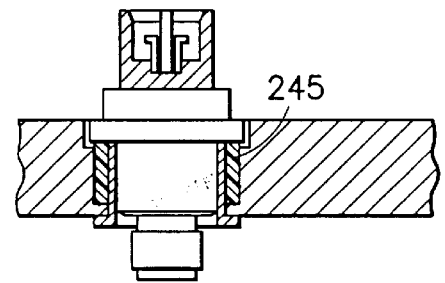

Blind mate connector 210 includes a male connector component 212, a connector flange component 214, a connector body component 216 and a female connector component 218. Mount member 230 has hole 238 which is configured to mount connector component 250, i.e., blind mate connector 210. Hole 238 is defined by a plurality of internal diameter components (i.e., regions) having a particular diameter and thickness. The internal diameter components include a back facing groove 232, a spring groove 234 which holds a spring, and an overhang 236. Coil spring 220 is narrow enough to fit into spring groove 234; and flange nut 240 includes a cylindrical component 242 and a flange component 244. FIG. 2C illustrates the replacement of spring 220 by an elastic rubber insert 245.

As shown in FIGS. 2A and 2B, coil spring 220 is initially inserted into spring groove 234 of hole 238. Thereafter, blind mate connector 210 is inserted into hole 238 through back facing groove side 232 such that coil spring 220 surrounds connector body component 216. Flange nut 240 is then inserted into the overhang side of hole 238 between connector body component 216 and coil spring 220.

Figure 3B:
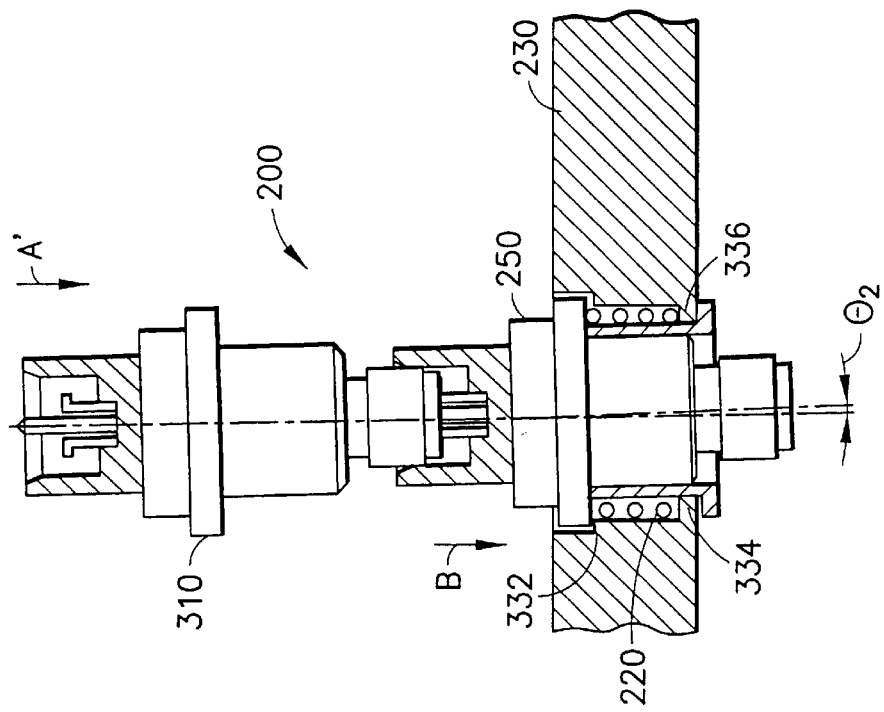
FIGS. 3A and 3B illustrate the connection operation of a hinge coupled arrangement with the floating mount apparatus of the first embodiment in FIGS. 2A and 2B.
Figure 3A:
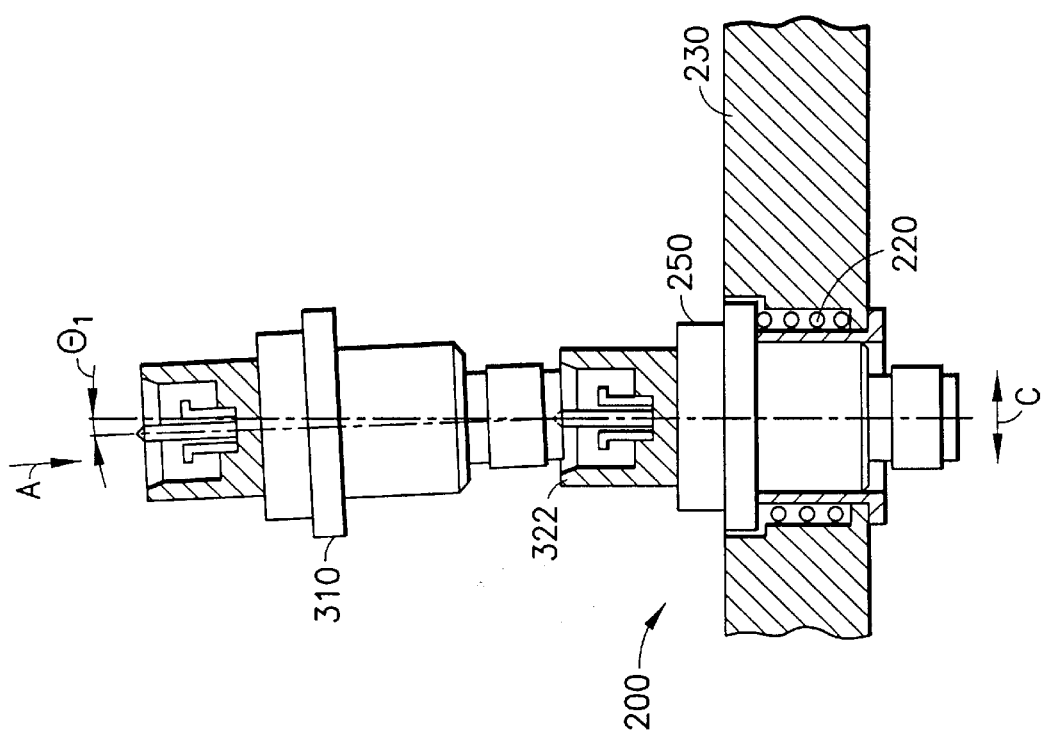

FIGS. 3A and 3B illustrate the operation of connecting an other side connector 310 and a connector 250 (of floating mount 200) that are hinge coupled. That is to say, as connector 310 is moved along a circular arc A defined by the hinge mechanism, connector component 250 makes contact with the opening end of the male connector portion of connector 310. At the initial coupling state, the error in the horizontal direction of connector 310 is compensated (i.e., absorbed) by the movement in the horizontal direction (arrow indicator C) of connector component 250. The central axis of connector 310 has an angle difference of $\theta_1$ with respect to the central axis of connector 250.

The mid-coupling state of other side connector 310 and connector component 250 is shown in FIG. 3B. Here, connector 310 descends along a circular arc A' which is a continuation of the circular arc A shown in FIG. 3A. The connector 310 tilts while descending (arrow indicator B) below the portion which it first contacted such that the central axis of connector 250 tilts to the angle $\theta_2$ which is equal to that of the central axis of connector 310. As a result, connectors 250, 310 are able to smoothly engage each other because the central axis of the connectors are aligned.

As connector component 250 tilts, the contact point of overhang 236 and cylindrical component 242 of the flange nut becomes the support point. The point of contact between the shoulder component of back facing groove 232 with spring groove (denoted 332 in FIG. 3) and flange component 214 of connector 250 allows connector 250 to adjust vertically and horizontally as connector 310 is inserted therein. That is to say, an initial clearance or space between back facing groove 232 and flange component 214 of connector 250 provides connector 250 with a vertical and horizontal range of motion to remedy the error of the initial connection position of connector 310.

From the above observation, in the first embodiment, it is possible to achieve a movement range of 0.5 mm in the orthogonal direction, with +0.1 mm play in the horizontal direction as well as a +2 degrees tilt. This can be accomplished by selecting an appropriate thickness of overhang 236, an appropriate spacing of the body component of the connector with overhang 236, and an appropriate spacing of the shoulder component of back facing groove 232 with the spring groove and flange component 214 of the connector.

If overhang 236 is excessively thick, the range of the tilt angle will be overly restricted at the time that the connector component tilts. Overhang 236 should have a thickness that is thinner than the height of the mount hole. It is preferred that the thickness of overhang 236 is below 15 percent of the height of the mount hole.

Figure 4A:
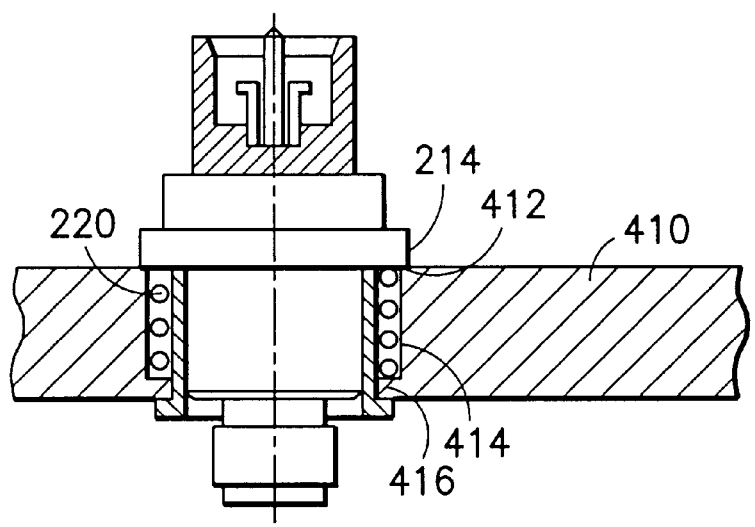
FIGS. 4A and 4B, respectively, show block diagrams of other embodiments of the floating mount apparatus in accordance with the present invention.
Figure 4B:
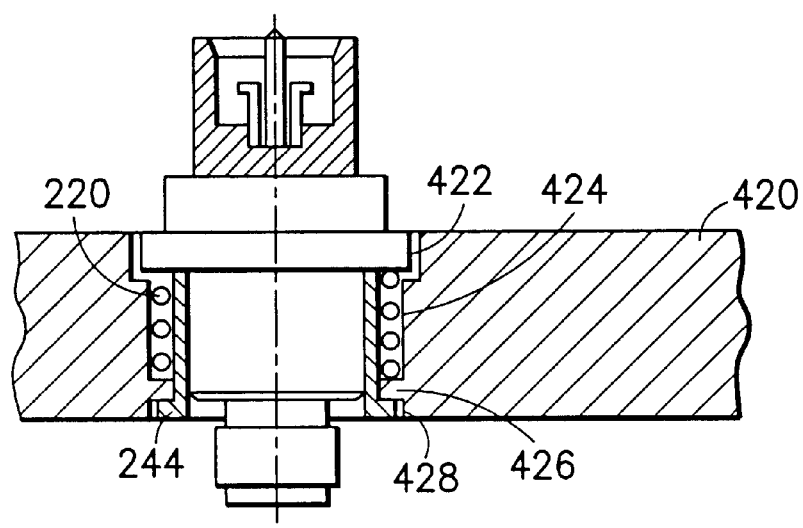

FIGS. 4A and 4B illustrate other embodiments of the floating mount apparatus in accordance with the present invention. FIG. 4A shows an embodiment which does not include a back facing groove on the mount member. Instead, mount member 410 has a hole shoulder component 412, a spring groove 414 and an overhang 416. A flange 214 of the connector component adjusts the movement amount by making contact with hole shoulder component 412. Although the error of the early position of the connector increases, such an arrangement is appropriate for use when there is insufficient thickness in the mount member 410.

FIGS. 4B illustrates an overhang 426 of mount member 420, arranged in the inner component of the hole and not on the surface of mount member 420. Mount member 420 includes a back facing groove 422, a spring groove 424, and a back facing groove 428 for use with the flange nut. Because overhang 426 is positioned in the inner component of the hole, the thickness of overhang 426 is thinner. Therefore, it is necessary that both of the back facing grooves are wider in order to secure the movement amount of the connector component tilt.

Note that the above embodiments of the present invention are provided as examples and can be modified without taking away from the functionality of the present invention.

For instance, female connector component 218 of the blind mate connector is not essentially required. Female connector component 218 can be replaced with another appropriate type of construction that connects the coaxial cable.

Although coil spring 220 is utilized in the nearly cylindrical shape space of back groove 234, other types of springs or elastic members, i.e., made from elastic rubber, with the appropriate elasticity may also be utilized. For instance, a leaf spring with the appropriate elasticity may be wound in the nearly cylindrical shape and utilized in place of a coil spring.

The coaxial connector that is mounted to the floating mount apparatus is not required to be a male connector. Instead, the coaxial connector can be a female connector. Also, the coaxial connector need not be a blind mate connector, but instead can be an alternative snap-in type coaxial connectors.

The overhang of the mount member is not required to have a perfect ring shape. An imperfect ring such as a slit may be utilized so long as it does not impede performance.

In summary, the present invention provides a floating mount apparatus for a coaxial connector which has the ability to adjust the central axis of the connector in the appropriate horizontal and vertical directions in order to provide a smooth, errorless engagement with another connector. The present invention also provides a floating mount apparatus for a coaxial connector which is adapted for use in an hinge coupled arrangement and which provides a coaxial connector for use with high band signals. As such, the floating mount for a connector is suited for connecting a prober and test head that are hinge coupled.

The invention having thus described with particular reference to the preferred forms thereof, it will be obvious that various changes and modifications may be made therein without departing from the spirit and scope of the invention as defined in the appended claims.

I claim:

1. A floating mount apparatus for a coaxial connector, comprising:

a coaxial connector with a central axis and having a first external diameter region and a second external diameter region adjacent to said first external diameter region, said second external diameter region having a diameter smaller than the diameter of said first external diameter region;

a receiving aperture having a first internal diameter region adapted to receive the first external diameter region with a clearance therebetween, and a second internal diameter region adapted to receive the second external diameter region with a space therebetween;

a flange member having a cylindrical portion positioned about said second external diameter region in said space and a flange that bears against a surface of said receiving aperture that is opposed to said first internal diameter region; and resilient means, positioned in said space between an outer diameter of said flange member and said second internal diameter region of said receiving aperture, for providing a resilient bias between said coaxial connector and said receiving aperture.

2. The apparatus as recited in claim 1, wherein said third internal diameter region has a thickness along a receiving centerline of said receiving aperture that is less than 15 percent of a height of said receiving aperture along said receiving centerline.

3. The apparatus as recited in claim 1, wherein said resilient means comprises a coil spring.

4. The apparatus as recited in claim 1, wherein said resilient means is formed of elastic rubber.

5. The apparatus as recited in claim 1, wherein said receiving aperture further includes a third internal diameter region adjacent to said second internal diameter region, said third internal diameter region having a smaller diameter than said flange and including said surface of said receiving aperture that is opposed to said first internal diameter region.

6. The apparatus as recited in claim 1, wherein said flange member comprises a flange nut, having a substantially cylindrical body and an extending flange, for securing said coaxial connector to said receiving aperture, wherein said coaxial connector and said flange nut engage said receiving aperture from opposing ends of said receiving aperture.

7. The apparatus as recited in claim 1, wherein said coaxial connector is coupled to an opposing connector such that both connectors mutually push against each other along said central axis without rotating.

8. The apparatus as recited in claim 1, wherein said coaxial connector is capable of transmitting a high frequency signal of up to 6 GHz.

* * * * *